United States Patent [19]
Kawakita et al.

[11] Patent Number: 5,739,053
[45] Date of Patent: Apr. 14, 1998

[54] PROCESS FOR BONDING A SEMICONDUCTOR TO A CIRCUIT SUBSTRATE INCLUDING A SOLDER BUMP TRANSFERRING STEP

[75] Inventors: Tetuo Kawakita; Kenzo Hatada, both of Osaka, Japan

[73] Assignee: Matsushita Electric Industrial Co., Ltd., Osaka, Japan

[21] Appl. No.: 440,991

[22] Filed: May 15, 1995

Related U.S. Application Data

[63] Continuation-in-part of Ser. No. 140,473, Oct. 25, 1993, abandoned.

[30] Foreign Application Priority Data

Oct. 27, 1992 [JP] Japan ............... 4-288533

[51] Int. Cl.$^6$ ............ H01L 21/283; H01L 21/56; H01L 21/58; H01L 21/603
[52] U.S. Cl. ............ 438/108; 438/118; 438/125; 438/126; 228/180.22
[58] Field of Search ............ 437/183, 211; 257/737, 738; 228/180.22

[56] References Cited

U.S. PATENT DOCUMENTS

| | | | |
|---|---|---|---|
| 4,494,688 | 1/1985 | Hatada et al. | 228/180 A |
| 4,693,770 | 9/1987 | Hatada | 156/151 |
| 5,012,969 | 5/1991 | Hatada et al. | 228/104 |
| 5,037,780 | 8/1991 | Fujimoto et al. | 437/212 |
| 5,071,787 | 12/1991 | Mori et al. | 437/183 |
| 5,128,746 | 7/1992 | Pennisi et al. | 357/72 |

*Primary Examiner*—David Graybill
*Attorney, Agent, or Firm*—McDermott, Will & Emery

[57] ABSTRACT

A process wherein substrate preliminary formed with bumps by electrolytic plating or other technique is prepared. The semiconductor device is opposed to the substrate with the bumps so that the Al electrodes of the semiconductor device are aligned with respect to the bumps and brought into contact with each other. Then, the Al electrodes of the semiconductor device and the bumps are bonded together by the application of pressure and heat with an Au—Al alloy layer formed therebetween. Subsequently, the bumps are peeled off the substrate so as to be transferred to the respective Al electrodes. Thereafter, the semiconductor device is opposed to a circuit board so that the bumps are aligned with respect to the electrodes of wiring and brought into contact with them. Then, the bumps and the electrodes of wiring are bonded together more securely by the application of a larger pressure at a higher temperature or by the application of pressure and heat for a longer period of time than in the preceding process with another Au—Al alloy layer newly formed therebetween to cover a wider range. Thereafter, the bumps and electrodes of wiring are fixed and connected by means of a photo-curing insulating resin. Thus, the bonds between the Al electrodes and the bumps are strengthened while preventing the considerable deformation of the bumps before they are connected to the electrodes of wiring. According to the connecting method, connecting reliability is greatly improved when the transfer method whereby the bumps are easily formed on the electrodes of the semiconductor device at low cost is applied to the flip flop method or to the MBB method.

10 Claims, 9 Drawing Sheets

FIG. 8(a) MODE 1
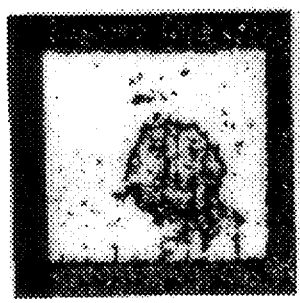
FIG. 8(b) MODE 2
FIG. 8(c) MODE 3
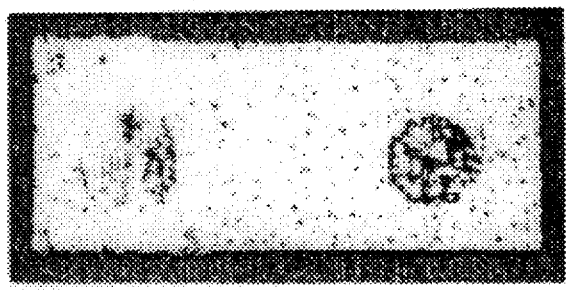
FIG. 8(d) MODE 4
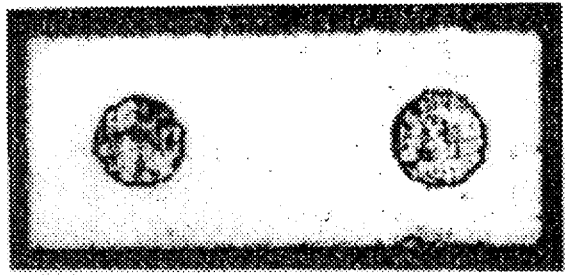
FIG. 8(e) MODE 5
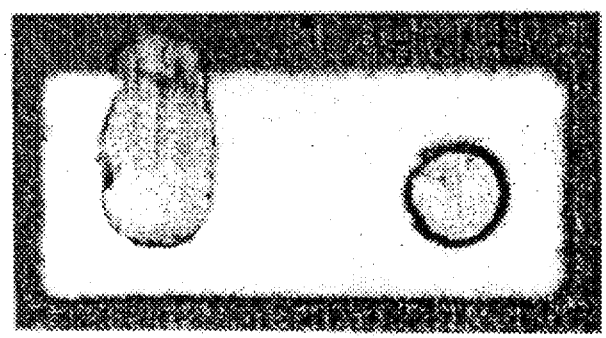
FIG. 8(f) MODE 1
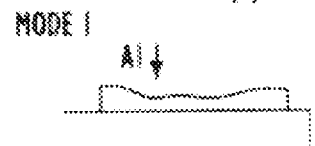
FIG. 8(g) MODE 2
FIG. 8(h) MODE 3
FIG. 8(i) MODE 4
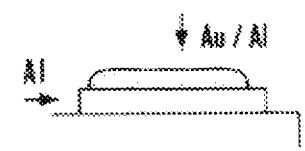
FIG. 8(j) MODE 5
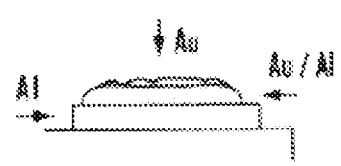

PROCESS FOR BONDING A SEMICONDUCTOR TO A CIRCUIT SUBSTRATE INCLUDING A SOLDER BUMP TRANSFERRING STEP

This application is a Continuation-In-Part of application Ser. No. 08/140,473, filed Oct. 25, 1993, abandoned.

BACKGROUND OF THE INVENTION

The present invention relates to a method of fabricating a semiconductor apparatus in which the electrodes of a semiconductor device are connected to the electrodes of a circuit board with bumps interposed therebetween.

In recent years, an increasing number of electronic apparatus in which a plurality of semiconductor devices are mounted have been developed. These electronic apparatus include a memory card, liquid-crystal display and EL display, each of which requires a technique of mounting a plurality of LSI chips on a substrate with a specified area to provide a high-density and flat-type apparatus. Among effective means to realize such high-density mounting of LSI chips is a micro-bump bonding method (hereinafter referred to as the MBB method). According to the method, bump electrodes formed from a metal on the Al electrodes of LSI chips are bonded under pressure to the electrodes of wiring on a circuit board by means of a photo-curing insulating resin. In this case, the electrodes on both sides are electrically connected only by the contracting force of the resin. As described above, the method requires the bumps to be formed directly on the Al electrodes of LSI chips. In a conventional method of forming the bumps directly on the Al electrodes, a multi-layer metal film composed of Cr—Cu or Ti—Pd, called a barrier metal, is formed on the Al electrodes of the LSI chips, followed by the formation of the bumps thereon by electrolytic plating. However, such direct formation of the bumps on the Al electrodes of LSI chips requires a sequence of deposition, photolithographic, and etching processes to be performed. During these processes, the LSI chips may be damaged, which causes the reduction of production yield, the increase of overall mounting cost, and the deterioration of reliability. Moreover, it is difficult to obtain LSI chips on which bumps are preliminarily formed, so that the conventional method is disadvantageous in that it is lacking in versatility.

As a means to eliminate the above-mentioned disadvantage, for example, Japanese Patent Publication No. 2-7180 discloses a method in which bumps, which have been preliminarily formed on another substrate, are transferred and bonded to the Al electrodes of LSI chips.

Below, the process of the method, combined with the process of the aforesaid MBB method, will be described with reference to FIGS. 5(a) to 5(g). FIGS. 5(a) to 5(g) are cross sections showing the transition of the conventional fabrication process. First, as shown in FIG. 5(a), a substrate 21 for bumps, which is provided with bumps 22 composed of Au, is prepared. The bumps 22 were previously formed on the substrate 21 for bumps chiefly by electrolytic plating. Then, a semiconductor device 23 is positioned over the substrate 21 for bumps so that each of the Al electrodes 24 of the semiconductor device 23 is aligned with respect to the corresponding bump 22.

Next, as shown in FIG. 5(b), the semiconductor device 23, with its Al electrodes 24 being in contact with the bumps 22, is pressed and heated from its undersurface by a bonding tool 25. As shown in FIG. 6(a), the pressing and heating process generates an alloy layer 32 between the bumps 22 and Al electrodes 24, so that the bumps 22 are bonded to the Al electrodes 24. The pressing and heating process is performed for approximately 1 sec at a temperature of 380° to 460° C. and under a pressure of 7 to 10 g per bump. Between the bumps 22 and Al electrodes 24 is formed an Au—Al alloy layer 32. The alloy layer obtained here is extremely thin, because the pressing and heating process mentioned above was performed under the minimum pressure, at the minimum temperature, and for the minimum period of time so that the bumps 22 would not undergo considerable changes in terms of configuration and magnitude.

Subsequently, as shown in FIG. 5(c), the bonding tool 25 is elevated while attracting the semiconductor device 23 with suction through a vacuum suction hole 26 by using a vacuum pump (not shown), so that the bumps 22 are peeled off the substrate 21 for bumps to be transferred to the Al electrodes 21.

Next, as shown in FIG. 5(d), the semiconductor device 23 to which the bumps 22 were transferred and bonded in the preceding process is aligned with respect to a circuit board 28 which has electrodes 27 of wiring in the positions corresponding to the respective bumps 22. Meanwhile, a photo-curing insulating resist 29 is applied to the region of the circuit board 28 corresponding to the semiconductor device 23.

Thereafter, as shown in FIG. 5(e), the bumps 22 are pressed and bonded to the electrodes 27 of wiring by a pressing tool 30 at ordinary temperature. The insulating resin 29, which was interposed therebetween, is thrust away to the surrounding area, so that the bumps 22 are brought into secure electrical connections with the electrodes 27 of wiring. To provide the perfect connections therebetween, the bumps 22 should be deformed considerably. The bumps 22 are deformed to the extent that their thickness, which was about 10 μm prior to the pressing process, is reduced to 4 to 5 μm. The load needed to deform each bump is 90 to 100 g per bump.

After that, as shown in FIG. 5(f), the circuit board 28 is irradiated with an ultraviolet ray from its undersurface or side face to cure the photo-curing insulating resin 29.

The application of pressure is then ceased, thereby completing the connections as shown in FIG. 5(g). Thus, in the conventional method, the circuit board 28 and semiconductor device 23 are bonded together under pressure without heating, and then the foregoing two are fixed by means of the photo-curing insulating resin 29. The method, which has improved by overcoming the conventional problems, has the following characteristics:

1. Since non-heating connections are realized, a thermal stress is not induced.

2. The connecting members are insusceptible to the thermal stress induced by the difference in coefficient of thermal expansion since they are bonded together (kept in contact) merely by the application of pressure.

3. The method is applicable to a narrower pitch since metallic bonds are not involved in the bonds between the bonded members.

However, the foregoing conventional method has the following disadvantage.

As described above, the Au—Al alloy layer 32 which was formed between the bumps 22 and Al electrodes 24 in the first transferring/bonding step is extremely thin, as shown in FIG. 6(a). This is because it is sufficient for the Au—Al alloy layer 32 to provide the binding force necessary to peel the bumps 22 off the substrate 21 for bumps and that, if the bumps 22 are considerably deformed, mal-connection may be caused in the subsequent process. That is, if a large pressure and heat at a high temperature are applied or if the bonding process is continued for a long period of time, the columnar bumps 22 formed by electrolytic plating or other technique will be deformed considerably, resulting in the mal-connection between the bumps 22 and electrodes 27 of wiring in the following process. Therefore, the bumps 22 are transferred onto the Al electrodes 24 without substantially being deformed.

Thereafter, the bumps 22 are greatly deformed under a heavy load of 90 to 100 g per bump without being heated so as to be pressed onto the electrodes 27 of wiring on the circuit board 28 (see FIG. 5(e)), as described above. However, as shown in FIG. 6(b), the Au—Al alloy layer 32 is ruptured upon the considerable deformation of the bumps 22, so that the resulting fragments of the Au—Al alloy layer 32 which was continuously formed in the preceding process are scattered over the vicinity of the interface between the bumps 22 and Al electrodes 24. Hence, the region other than the fragmentary Au—Al alloy layer 32 in the vicinity of their interface is seldom alloyed, resulting in less reliable bonding in terms of strength.

If a reliability test such as the high-temperature standing test is performed with the junction formed by the fabrication method, the contact resistance between the bumps 22 and Al electrodes 24 is disadvantageously increased in a relatively short period of time. If the test is further continued, electrical connections will be severed completely in the end. In the case where the circuit board and semiconductor device have different coefficients of thermal expansion and the resulting semiconductor apparatus is used at a high temperature, in particular, a large stress is induced between the semiconductor device 23 and Al electrodes 24 due to the difference in coefficient of thermal expansion therebetween, so that even the bonds between the semiconductor device 23 and Al electrodes 24 may be destroyed.

A known method of bonding semiconductor devices is disclosed in EP 0 208 494 A3 (Hatada et al), comprising the steps of: transferring metal bumps to a first electrode of a first semiconductor device, applying pressure and heat to the first electrode of the first semiconductor device via the metal bumps, and aligning the metal bumps to a second electrode of a second semiconductor device, thereby the first electrode is bonded to the second electrode via the metal bumps. However, in this method, heating to about 500° C. to about 550° C., is required in order to form an excellent alloy layer between the metal bumps and respective electrodes. Further, this method is not applicable to a semiconductor device on a glass substrate and printed substrate used in a liquid crystal device and the like.

SUMMARY OF THE INVENTION

An object of the present invention is to provide a method of fabricating a semiconductor apparatus in which the electrodes of a semiconductor device are connected to electrodes of wiring on a glass substrate or a printed substrate via bumps, whereby the bumps are transferred and bonded to the electrodes of the semiconductor device, the bumps are aligned with respect to the electrodes of wiring, and then the electrodes of the semiconductor device and bumps are subjected to a re-alloying process, so as to strengthen the bonds between the electrodes of the semiconductor device and bumps without deteriorating the connections between the electrodes of the semiconductor device and electrodes of wiring.

Concretely, in a method of fabricating a semiconductor apparatus provided with a circuit board made of a resin material or a glass material on which electrodes of wiring are formed and with a semiconductor device on which electrodes are formed so as to be connected to said electrodes of wiring via bumps when the semiconductor device is mounted in said circuit board, there are provided: a preparation step of preliminarily forming a substrate for bumps on which the bumps are positioned corresponding to the electrodes of said semiconductor device; a transferring/bonding step of opposing said semiconductor device to the substrate for bumps so that the electrodes of said semiconductor device are aligned with respect to the bumps, applying a pressure to either of said semiconductor device and substrate for bumps so that it is pressed against the other, heating the electrodes of the semiconductor device and bumps so as to form an alloy layer between said electrodes of the semiconductor device and said bumps, and then transferring said bumps from the substrate for bumps to the electrodes of the semiconductor device; a re-alloying step of opposing said semiconductor device to the circuit board so that the bumps, which were transferred and bonded to the electrodes of the semiconductor device in said transferring/bonding step, are aligned with respect to said electrodes of wiring, applying a pressure to either of said semiconductor device and the circuit board so that it is pressed against the other, heating the electrodes of the semiconductor device and bumps to form a new alloy layer therebetween which covers a wider range and which strengthens the bonds between the electrodes of said semiconductor device and said bumps which enlarges and strengthens the alloy layer obtained in said transferring/bonding step; and a connecting step for providing electrical connections between said bumps and electrodes of wiring while applying the pressure to either of the semiconductor device and circuit board so that it is pressed against the other.

With the method described above, the electrodes of the semiconductor device and bumps are pressed and heated in the transferring/bonding step. Consequently, an alloy layer is formed therebetween to bond the electrodes of the semiconductor device and bumps. Subsequently, the bumps are transferred from the substrate for bumps to the electrodes of the semiconductor device. Then, the bumps transferred to the semiconductor device are brought into contact with the electrodes of wiring on the circuit board and further pressed and heated in the re-alloying step to strengthen the bonds between the bumps and electrodes of the semiconductor device. In the transferring/bonding step, it is sufficient for the bumps to be bonded to the electrodes of the semiconductor device only with the minimum bonding strength, so that the degree of deformation of the bumps can be minimized without deteriorating the connections between the semiconductor device and the circuit board in the subsequent connecting step. In the re-alloying step, greater pressure and heat than those applied in the preceding step are applied with the bumps being aligned with respect to the electrodes of wiring, so that an alloy layer covering a wider range is formed between the electrodes of the semiconductor device and bumps. In this case, even if the bumps are greatly deformed, there will be no malconnections between the bumps and electrodes of wiring, for the bumps are already aligned and in contact with the electrodes of wiring. Moreover, since the alloy layer covering a wider range is formed between the electrodes of the semiconductor device and bumps, a sufficiently thick alloy layer will be ensured therebetween even if the bumps are considerably deformed thereafter. Consequently, secure bonds can be obtained between the electrodes of the semiconductor device and bumps through the alloying process without causing malconnections between the electrodes of the semiconductor device and bumps due to the considerable deformation of the bumps. The bonds between the electrodes of the semiconductor device and bumps are sufficiently strong to withstand a stress resulting from the difference in coefficient of thermal expansion between the semiconductor device and circuit board and to prevent the increase in electric resistance between the electrodes of the semiconductor device and bumps or the disconnection therebetween, so that the reliability of the semiconductor apparatus is improved.

In order to form, in the re-alloying process, an alloy layer that covers a wider range than the range covered by the alloy layer in the transferring/bonding process, the method mentioned above can be subdivided into a method of applying a larger pressure, a method of heating at a higher temperature, and a method of applying pressure and heat for a longer period of time.

In the case of applying a larger pressure, fabrication time and cost can be reduced by simultaneously performing the re-alloying process and the connecting process for providing connections between the bumps and electrodes of wiring.

Moreover, by fixing at least said bumps and electrodes of wiring with an insulating resin which was injected into the space therebetween, the semiconductor device is connected to the circuit board while easily preventing the short-circuit between the electrodes of individual semiconductor devices.

The electrode of the semiconductor device is preferably composed of Al or an Al-type alloy and said electrode of wiring is preferably composed of at least one of Au, Ag, Ni, Cu, and an alloy containing one of these metals.

The circuit board can be a printed circuit board which is composed of a plastic board with a circuit formed thereon. In this case, if the resulting semiconductor apparatus is placed in an ambience at high temperature, a large thermal stress is induced at the connecting members of the semiconductor device and printed circuit board due to the large difference in coefficient of thermal expansion therebetween. Since the re-alloying process according to the present invention provides secure bonds between the electrodes of the semiconductor device and bumps, the disconnection therebetween due to the difference in coefficient of thermal expansion between the semiconductor device and printed circuit board can be prevented.

BRIEF DESCRIPTION OF THE DRAWING FIGURES

FIGS. 1(a) to (h) are cross sections showing the transition of the process of fabricating a semiconductor apparatus in accordance with the following embodiment;

FIGS. 2(a) and 2(b) are cross sections showing the difference between an Au—Al alloy layer in a transferring/bonding process and the Au—Al alloy layer in a re-alloying process;

Figure 6A:
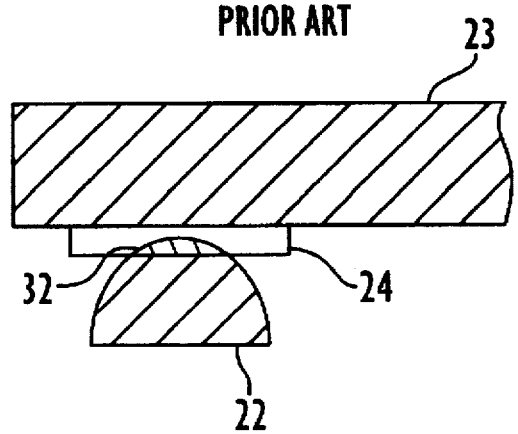
Figure 6B:
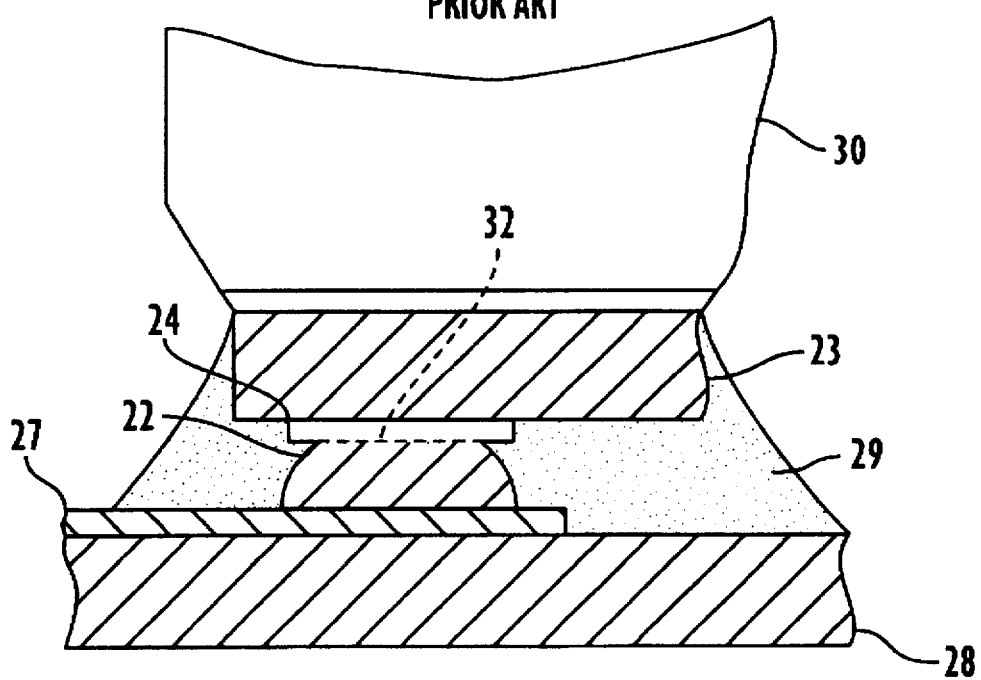
Figure 7:
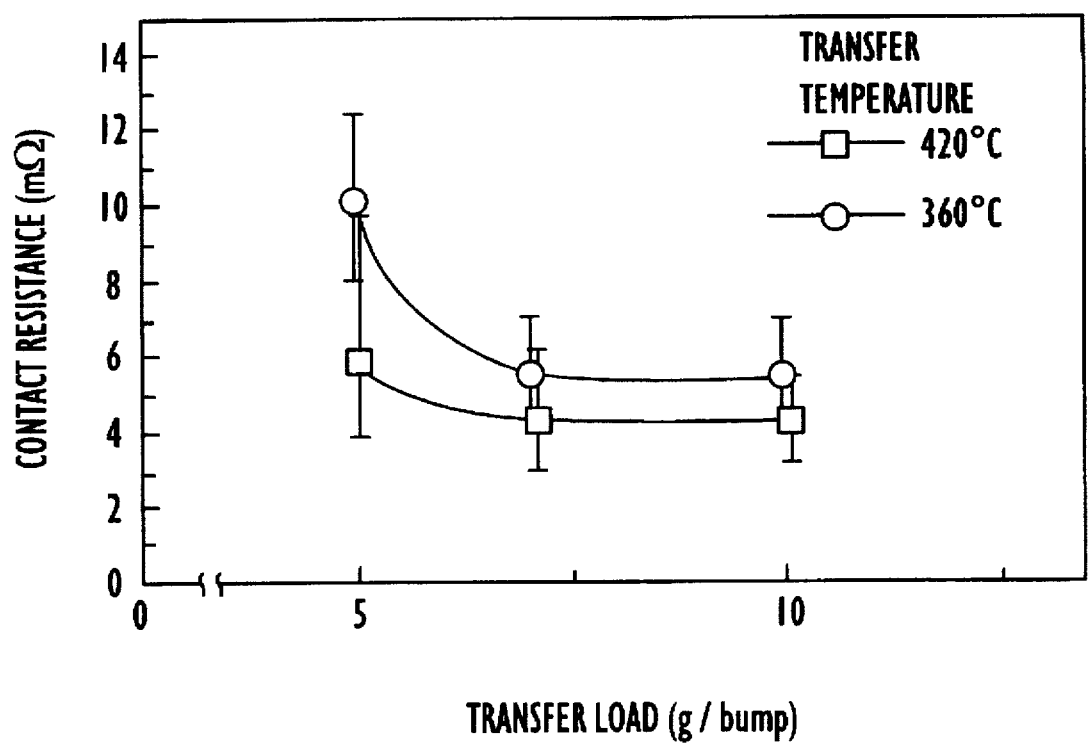
Figure 9A:
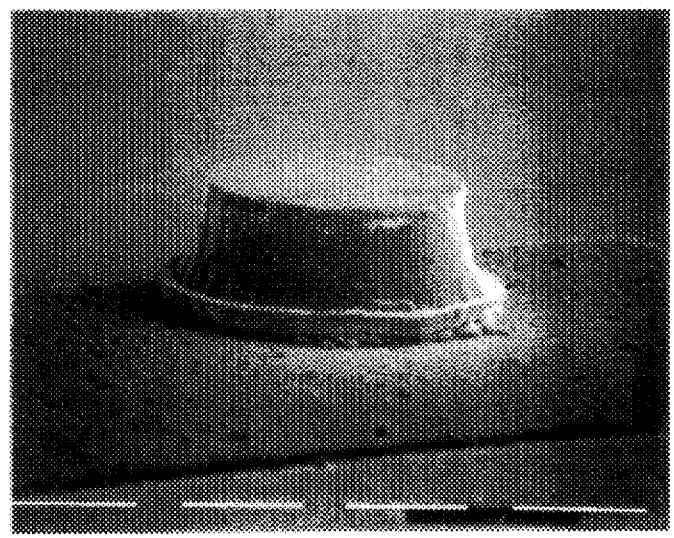
Figure 9B:
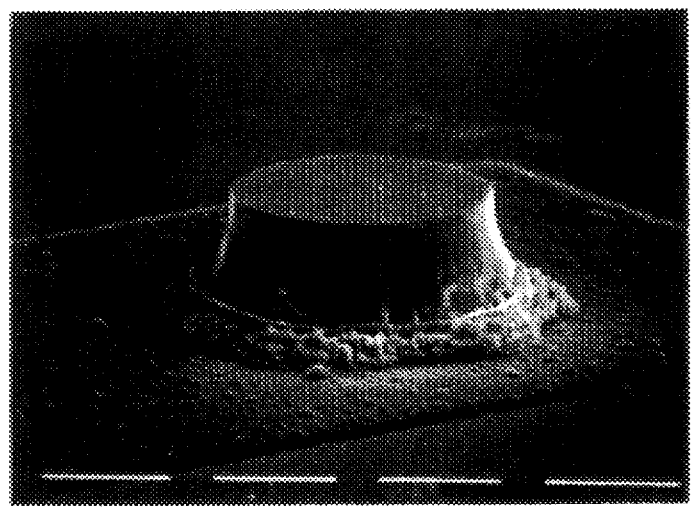

FIGS. 5(a) to 5(g) are cross sections showing the transition of the conventional process of fabricating a semiconductor apparatus;

FIGS. 6(a) and 6(b) are cross sections showing the difference between the Au—Al alloy layer in the transferring/bonding process and the Au—Al alloy layer in the wiring process in accordance with the conventional fabrication method;

FIG. 7 is a graph showing contact resistance/transfer load dependencies;

FIGS. 8(a), 8(b), 8(c), 8(d) and 8(e) are picture respectively showing plane surfaces for respective shear modes of the transferred bump;

FIGS. 8(f), 8(g), 8(h), 8(i) and 8(j) are sectional views of FIGS. 8(a), 8(b), 8(c), 8(d) and 8(e) respectively; and FIGS. 9(a) and 9(b) are SEM pictures respectively showing a bonding part of the transferred bump under respective conditions.

DETAILED DESCRIPTION OF THE PREFERRED EMBODIMENT

Below, an embodiment of the present invention will be described with reference to FIGS. 1(a) and 1(h) and to FIG. 2.

Figure 1A:
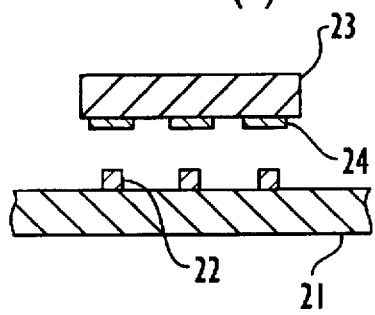
Figure 1B:
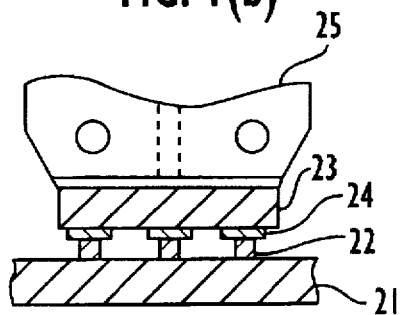
Figure 1C:
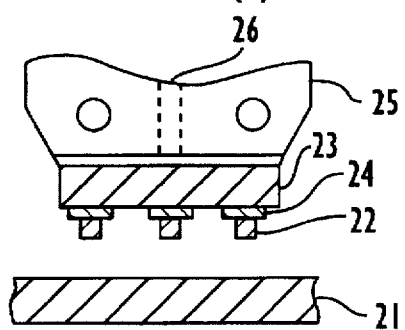
Figure 1D:
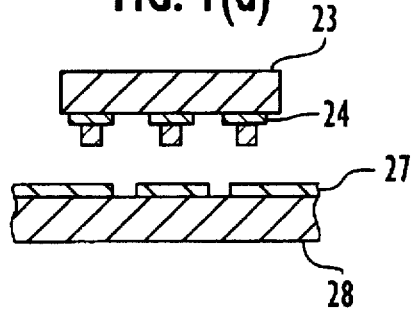
Figure 1E:
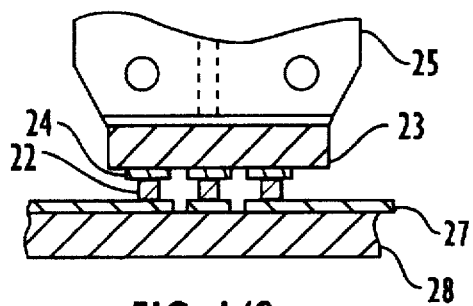
Figure 1F:
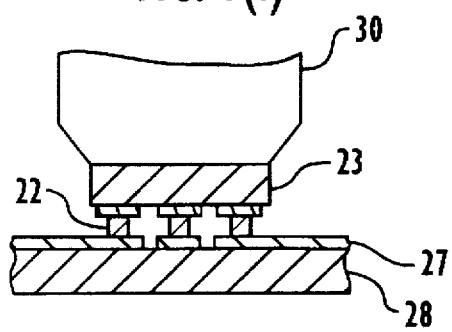
Figure 1G:
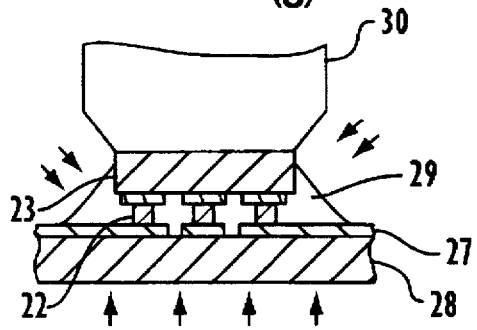
Figure 1H:
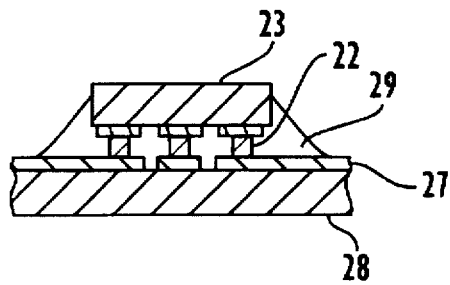

FIGS. 1(a) and 1(h) are cross sections illustrating the step sequence of a method of fabricating a semiconductor apparatus according to the present invention. First, as shown in FIG. 1(a), a semiconductor device 23 is positioned over a substrate 21 for bumps. On the substrate 21 for bumps, bumps 22 composed of Au having a diameter of 30 µm and a height of 10 µm were previously mounted in specified positions by electrolytic plating or other technique, respectively. Then, each of the bumps 22 on the substrate 21 for bumps are aligned with respect to the corresponding Al electrode 24 on the semiconductor device 23.

Next, as shown in FIG. 1(b), a bonding tool 25 with a built-in heating system (not shown) is pressed on to the undersurface of the semiconductor device 23, so as to apply pressure and heat to the bumps 22 and Al electrodes 24. The application of heat and pressure is conducted for 1 sec at a temperature of 380° to 460° C. and under a pressure of 7 to 10 g per bump. Thus, the bumps 22 on the substrate 21 for bumps are loosely bonded to the Al electrodes 24 of the semiconductor device 23. Since the bonding tool 25 is provided with the heating system, the bottom portion thereof is composed of a heat-resistant material.

Next, as shown in FIG. 1(c), the bonding tool 25 is elevated while attracting the semiconductor device 23 with suction through a vacuum suction hole 26 by using a vacuum pump (not shown), so that the bumps 22 are peeled off the substrate 21 for bumps to be transferred and bonded to the Al electrodes 24 of the semiconductor device 23. FIGS. 1(a) and 1(c) illustrate the transferring/bonding process.

As a result, the bumps 22 composed of Au are bonded to the Al electrodes 24 with a thin Au—Al alloy layer 32 formed therebetween. Since the Au—Al alloy layer formed between the bumps 22 and the Al electrodes 24 is primarily for peeling the bumps 22 off the substrate 21, the temperature, pressure, and time used in the formation of the Au—Al alloy layer 32, which were also required to fulfill the transfer conditions, were minimized. Consequently, the bumps 22 are not substantially deformed under the bonding conditions. For example, the height of the bump 22 which was about 10 µm before the transferring/bonding process is reduced only by 1 to 2 µm.

Next, as shown in FIG. 1(d), a circuit board 28 such as a printed circuit board on which the electrodes 27 of wiring are formed is placed under the semiconductor device 23 to which the bumps 22 were transferred and bonded in the preceding process. The circuit board 28 is placed so that the positions of the electrodes 27 of wiring correspond to the positions of the Al electrodes 24 of the semiconductor device 23. Consequently, the bumps 22 are aligned with respect to the Al electrodes 24 and therefore to the electrodes 27 of wiring. The circuit board 28 is composed of a silicon or glass substrate. The electrodes 27 of wiring are composed of a material such as Cr—Au, Ti—Pd—Au, or ITO.

Subsequently, as shown in FIG. 1(e), the semiconductor device 23 is heated and pressed by the foregoing bonding tool 25, so that the bumps 22 are bonded to the electrodes 27 of wiring. In this case, the bonding process is performed for 1 to 2 sec at a temperature in the same range of 380° to 460° C. as that of the transferring/bonding process (shown in FIG. 1(b)) described above and under a pressure of 70 to 100 g per bump, which is about ten times larger than the pressure used in the transferring/bonding process. However, it is also possible to set the temperature at a value higher than that of the preceding transferring/bonding process within the range of 380° to 460° C. and to set the heating period at, e.g., 3 to 7 sec, which is longer than that of the transferring/bonding process. With the bonding process, the bumps 22 and Al electrodes 24 are alloyed again. The re-alloying process is illustrated in FIG. 1(e). In the present embodiment, the surface of the foregoing bonding tool 25 was composed of ceramic coated with a diamond thin film.

Figure 2A:
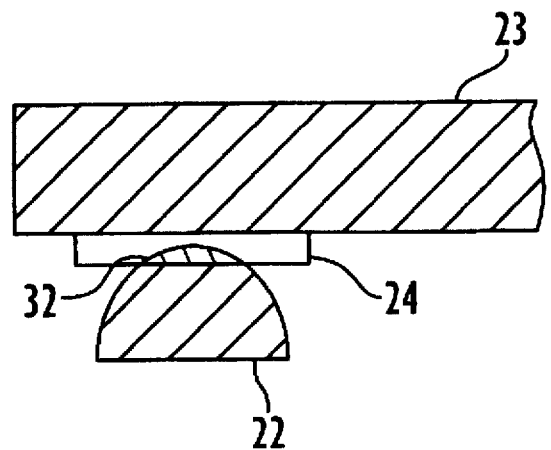
Figure 2B:
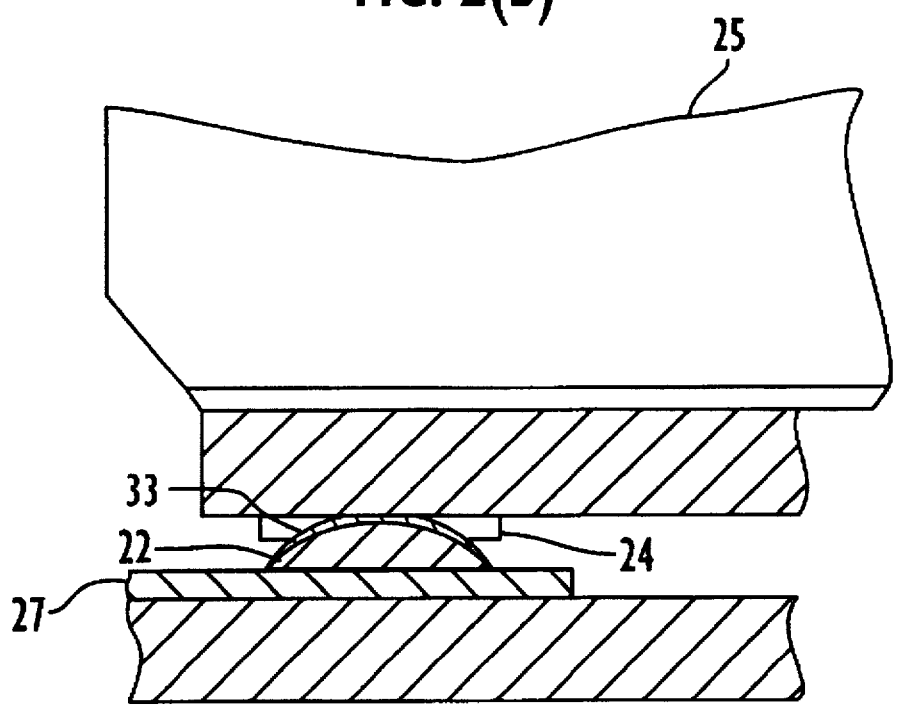

As shown in FIG. 2(b), a Au—Al alloy layer 33 which was formed in the foregoing re-alloying process covers a wider range than the range covered by the Au—Al alloy layer 32 which was formed in the foregoing transferring/ bonding process, so that the bumps 22 and the electrodes 27 of wiring are bonded more securely. In this case, the bumps 22 was deformed so that its height reached 4 to 5 μm.

Next, as shown in FIG. 1(f), the heat and pressure applied by the bonding tool 25 are removed, and then the semiconductor device 23 is pressed again by a pressing tool 30 at ordinary temperature. The pressure applied is 70 to 100 g per bump, similarly to the foregoing re-alloying process. Since the bumps 22 are pressed against the electrodes 27 of wiring at ordinary temperature, the process does not bring about re-alloying between the bumps 22 and electrodes 27 of wiring. However, the pressing process increases the accuracy with which the semiconductor device 23 is mounted in a specified position of the circuit board 28 and the strength with which the semiconductor device 23 and the circuit board 28 are connected. Since the pressing tool 30 is not heated, the bottom portion thereof is not necessarily composed of such a heat-resistant material as constitutes the bottom portion of the foregoing bonding tool 25. Instead, a material which can easily realize a high degree of flatness, such as glass, is used to constitute the bottom portion of the pressing tool 30.

After that, as shown in FIG. 1(g), an insulating resin is injected into the space between the semiconductor device 23 and circuit board 28. In this case, a photo-curing insulating resin 29 is used. The photo-curing insulating resin 29 can be injected only to the region in which the bumps 22 are formed, or alternatively, over the entire surface of the semiconductor substrate 23. Subsequently, the undersurface or side face of the circuit board 28 is irradiated with an ultraviolet ray, thereby curing the photo-curing insulating resin 29.

Then, as shown in FIG. 1(h), the pressure being applied is removed, thus completing the process of connecting the semiconductor device 23 to the circuit board 28.

In the foregoing embodiment, the re-alloying process (see FIG. 1(e)) was introduced after the transferring/bonding process (see FIGS. 1(b) and 1(c), so that the bonds between the Al electrodes 24 of the semiconductor device 23 and the bumps 22 are strengthened. As shown in FIG. 2(a), when the bumps 22 were transferred and bonded to the Al electrodes 24 of the semiconductor device 23, the Au—Al alloy layer 32 required only to transfer the bumps 22 to the Al electrodes 24 was formed therebetween. If more pressure and heat are applied, the bumps 22 are greatly deformed, and malconnections to the circuit board 28 may be caused after the transfer. In particular, the bumps 22 are generally formed by electrolytic plating into the shape of a column which extends vertically to the surface, so that their shapes are readily transformed by the application of pressure and heat into a spherical shape. In the foregoing embodiment, therefore, the deformation of the bumps 22 in the transferring/bonding process was minimized, so that the reduction in height of the bump 22 was suppressed to 1 to 2 μm.

In the re-alloying process, on the other hand, the undersurfaces of the bumps 22 are in direct contact with the electrodes 27 of wiring of the circuit board 28, so that the connections between the bumps 22 and the electrodes 27 of wiring are ensured even after the bumps 22 are greatly deformed. Accordingly, another pressing and heating treatment was performed under a larger pressure and at a higher temperature or for a longer period of pressing and heating so as to produce the Au—Al alloy layer 33 extending over a wider range. In this case, the bumps 22 were deformed so that their height reached 4 to 5 μm. Even when the bumps 22 are deformed considerably as described above, the bonds between the Al electrodes 24 and bumps 22 are strengthened to a great extent due to the presence of the sufficiently thick alloy layer between the Al electrodes and bumps. Consequently, even when the difference in coefficient of thermal expansion between the circuit board 28 and the semiconductor device 23 to be mounted on the circuit board 28 is considerably large, the breakage of the bonds which may be caused by a large stress resulting from the large difference in coefficient of thermal expansion can be efficiently prevented in using the semiconductor apparatus, thereby efficiently preventing the increase in contact resistance and the generation of disconnection.

Figure 3:
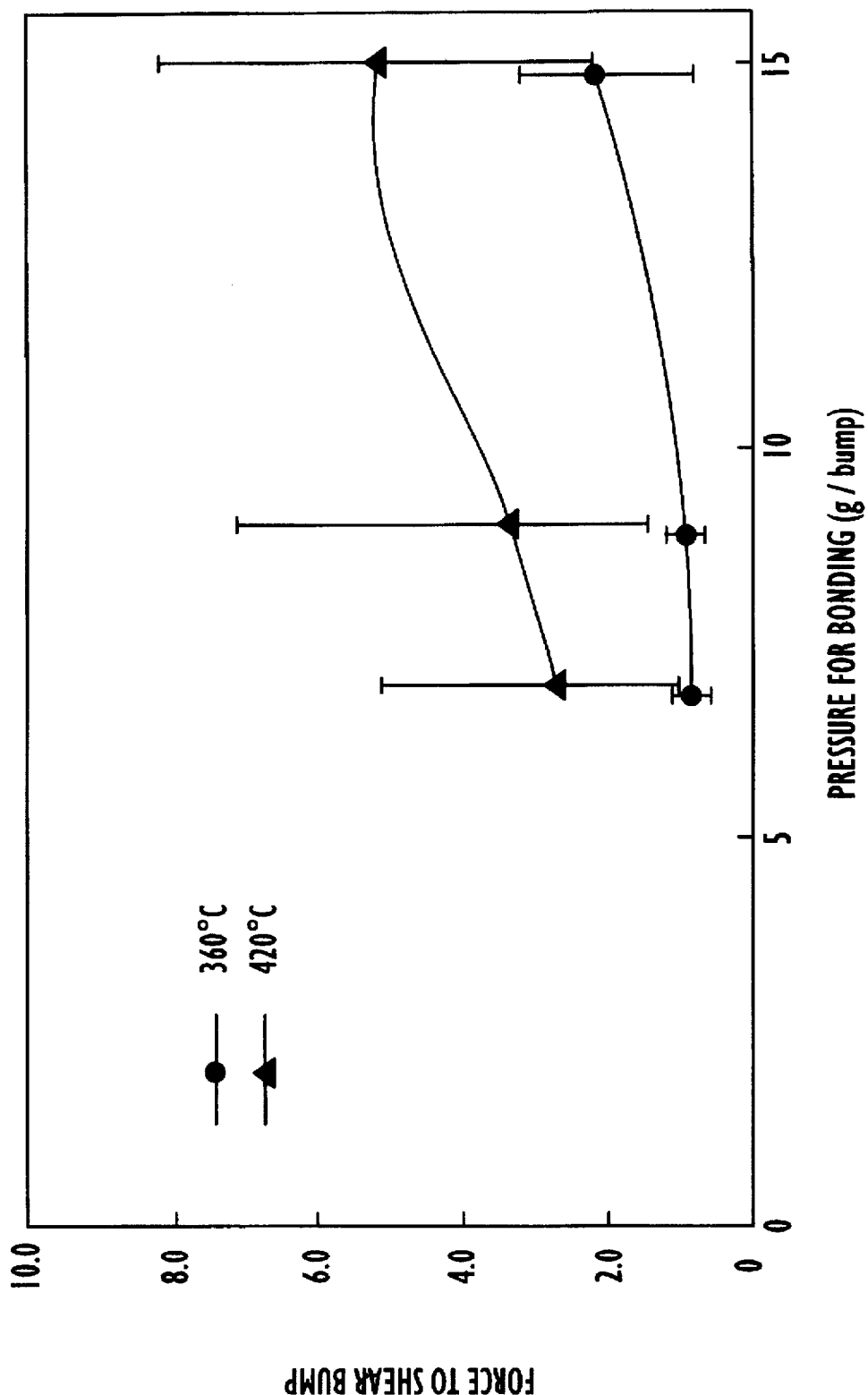
FIG. 3 is a graph obtained from experimental data which shows dependency of the shear strength between Al electrodes and bumps on the pressure applied and temperature for bonding.

Concrete experiments were conducted on the basis of the foregoing embodiment, the results of which will be described below. FIG. 3 shows the transition of the shear strength (at ordinary temperature) of the bump 22 when the pressure applied and the temperature for bonding are varied. In the drawing, vertical solid lines represent the range in which the measurements obtained for twenty-five samples are varied and marks ▲ and ● represent the mean values of the measurements obtained. As can be appreciated from the drawing, the force to shear a bump becomes larger as the applied pressure becomes larger or the temperature for bonding becomes higher.

Figure 4:
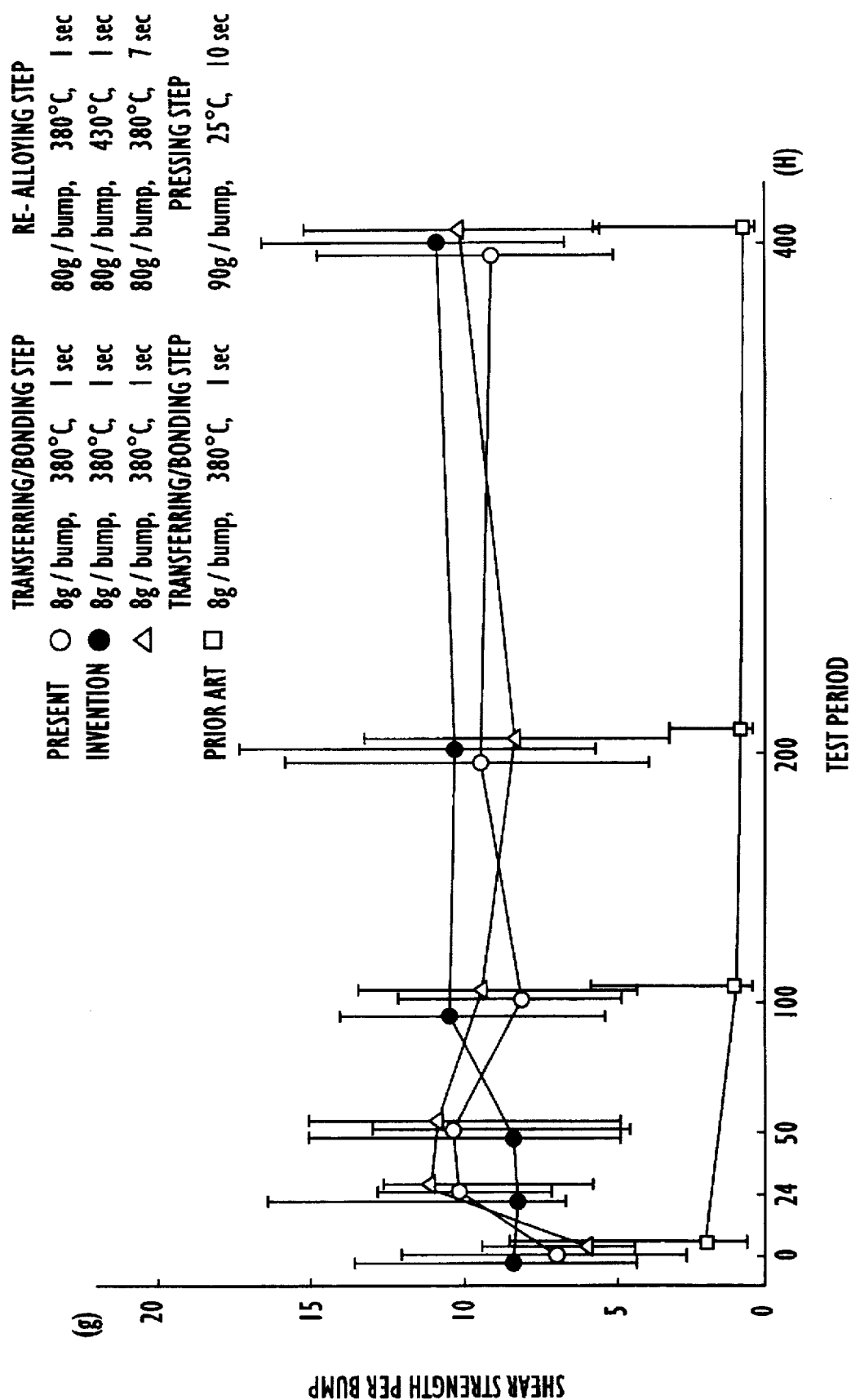
FIG. 4 is a graph showing the results of reliability tests performed on samples which were prepared according to the fabrication method of the present invention and to a conventional fabrication method.
Figure 5A:
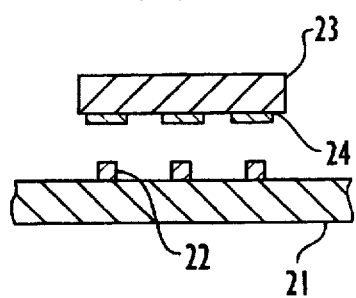
Figure 5B:
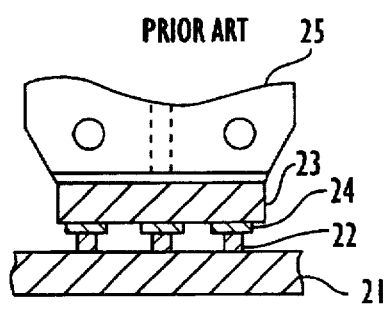
Figure 5C:
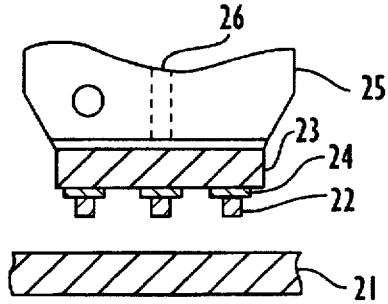
Figure 5D:
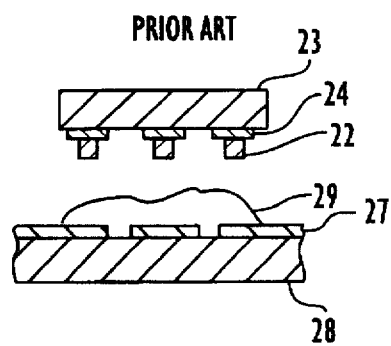
Figure 5E:
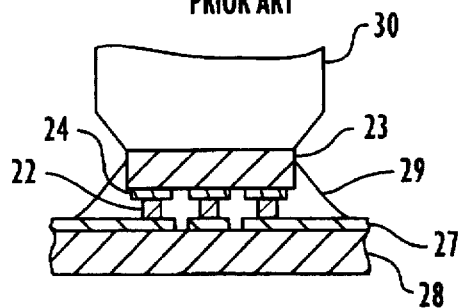
Figure 5F:
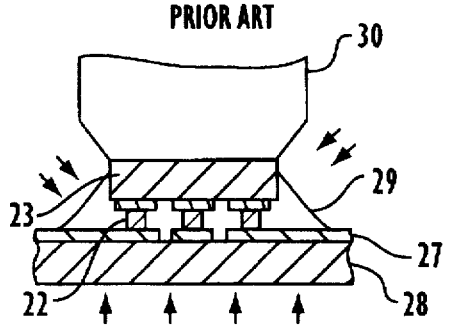
Figure 5G:
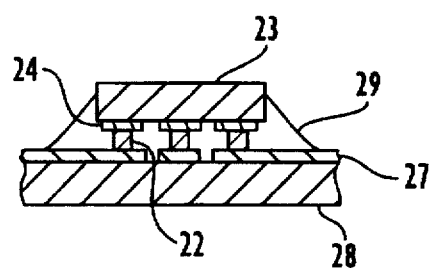

FIG. 4 shows the results of reliability tests for the shear strength per bump at a constantly high temperature of 150° C. The tests were performed for the purpose of comparing the conventional method which does not involve the re-alloying process and the method of the present invention. In the drawing, vertical solid lines represent the range in which the measurements obtained for twenty-five samples are varied and marks ○, ●, △, and □ represent the mean values of the measurements obtained. The marks ○, ●, and △ show the data for samples which were bonded according to the fabrication method of the present invention: ○ indicates a sample which was bonded under a larger pressure: ● indicates a sample which was bonded under a large pressure and at a higher temperature; and △ indicates a sample which was bonded for a longer period of time under a larger pressure and at a moderate temperature. The mark □ shows the data for a sample which was bonded according to the conventional fabrication method, so that the sample was subjected only to the pressing process at ordinary temperature and not to the re-alloying process after the transferring/bonding process. Specific conditions are noted in the drawing. As can be seen from the drawing, the initial shear strength of the sample according to the conventional method was small, and it tended to be considerably lowered before the test period reached 200 hours. Conversely, the initial shear strengths of the samples according to the present invention were large and they did not deteriorate even when the test period was elongated.

Although the re-alloying process (see FIG. 1(e)) and the connecting process (see FIGS. 1(f) and 1(g)) were performed using a bonding tool 25 and a pressing tool 30 in the foregoing embodiment, it is also possible to perform these two processes without changing the tool. In this case, the bottom portion of the bonding tool 25 is composed of a heat-resistant material such as ceramic and the flatness of the surface is improved to an extremely high degree, so that the process illustrated in FIG. 1(f) is performed while applying a large pressure (approximately as large as the pressure used in the foregoing example) to the undersurface of the semiconductor device 23 by using the bonding tool 25.

Although the Al electrode 24 of the semiconductor device 23 are composed of Al in the foregoing embodiment, the electrodes of the semiconductor device are often composed in practice of an Al-type alloy such as Al—Cu—Si alloy or Al—Ti—Si alloys, in addition to pure Al. However, the material of the electrodes of the semiconductor device is not limited to Al and Al-type alloys. Although the bumps 22 are composed of Au in the foregoing embodiment, the constituent of the bumps 22 is not limited thereto and a metal other than Au can be used to constitute the bumps 22. In particular, such metals as Cu, Ag, and Ni have small electric resistances and appropriate capabilities for plastic deformation, so that they are suitably interposed between the electrodes of the semiconductor device and the electrodes of wiring to achieve electric connections smoothly.

Although the photo-curing insulating resin 29 was used in the connecting process in order to connect the semiconductor device 23 to the circuit board 28 in the foregoing embodiment, it will be easily understood that a thermo-curing or other resin or a conductive material can be used instead. In this case, there are two types of methods to employ the insulating resin: the insulating resin can be injected after the re-alloying process by the application of pressure and heat, as described in the foregoing embodiment; or it can be preliminarily applied onto the circuit board 28 after the alignment of the bumps 22 with respect to the electrodes 27 of wiring in the process illustrated in FIG. 1(d), followed by the application of heat and pressure as shown in FIGS. 1(e) and 1(f), so as to be cured by the irradiation of an ultraviolet ray or by the application of heat as shown in FIG. 1(g).

Described below are results of an experiment performed for demonstrating the effects of the present invention.

FIG. 7 shows a relationship between a transfer condition and a contact resistance of a bump. The contact resistance of the bump decreases as the transfer load and transfer temperature increases. When the transfer load is 7 g per bump or more, the contact resistance is constant, about 5 mΩ, which does not present a problem in practice.

Bonding reliability will be discussed with reference to Table 1 below. Table 1 is a list of shear modes 1-5 (see FIGS. 8(a)–(j)) seen in a test for reliability of the bump bonded under conditions corresponding to the respective conditions in FIG. 4. In Table 1, the bump transferring step is carried out under the conditions of, as shown in FIG. 4, 380° C. tool temperature and 8 g/bump load for 1 second. The shear test is carried out in such a manner that the bump is kept at 150° C. for 0–1000 hours.

TABLE 1

| CONDITIONS | 1 | 2 | 3 | 4 |
|---|---|---|---|---|
| TOOL TEMP. °C. | 380 | 430 | 380 | 25 |
| LOAD g/bump | 80 | 80 | 80 | 90 |
| PERIOD second | 1 | 1 | 7 | 10 |
| TESTING PERIOD (HOURS) | MODE | MODE | MODE | MODE |
| 0 | 4.5 | 5 | 5 | 1,2,3 |
| 50 | 5 | 5 | 5 | 1,2 |
| 100 | 5 | 5 | 5 | 1,3 |
| 200 | 5 | 5 | 5 | 1,2,3 |
| 400 | 5 | 5 | 5 | 1,2 |
| 800 | 5 | 5 | 5 | 1,2 |
| 1000 | 5 | 5 | 5 | 1,2 |

FIGS. 8(a)–8(j) are pictures and sections respectively showing planer surfaces for respective shear modes 1–5. As described later, in shear modes 4, 5 the Al electrode under the bump is sufficiently deformed to be extruded around the bump to obtain an ideal alloy between Al and Au. In shear modes 1–3, little deformation of the Al electrode is caused, peal-off is shown at the boundary between the bump and Al with no good alloying between Al and Au. In shear mode 4, alloy is generated between Al and Au, which presents little problem in practice.

As shown in Table 1, only shear modes 4 and 5 appear under conditions 1–3 in the present invention, and shear mode 5 still appears after 1000 hours. This means excellent bonding reliability is achieved. While, under the conventional condition 4, shear modes 1, 2 or 3 appear, with inferior bonding reliability.

Comparison of the present invention with EP A 0 208 494 by Hatada et al is described below, wherein the metal bumps are composed of Au and the electrode is composed of Al.

In Hatada et al., an alloy layer is formed between Al and Au mainly in the second step. For this reason, an Al—Au alloy layer formed in the first step (transferring step) is destroyed, then another Al—Au alloy layer is formed. Therefore, severe conditions of high heating temperature, high pressure and long period of time must be applied in the second process. Under such high temperature, high pressure conditions, no problems are caused in Hatada et al because of bonding semiconductor devices to each other. On the other hand, with a circuit board made of a glass substrate or a printed substrate to which the semiconductor device is bonded via the metal bump (Au), the circuit board is damaged by the second step (re-alloying step) with high pressure and high temperature such as in Hatada et al. In order to avoid the damage, the conditions of the pressure and the temperature in the re-alloying step are alleviated so that the Al—Au alloy layer formed in the transferring/bonding step (correspond to the first step in Hatada et al.) is created without destruction. Then, the bonding step applying only pressure is carried out. Thereby, the electrode of the semiconductor device and that of the circuit board are firmly bonded to each other, avoiding damage to the circuit board.

Described next are suitable materials for the circuit board in the present invention. Table 2 indicates general data relating to durability to heat of a glass board, i.e., applicable temperature. As indicated in the column of applicable temperature of reinforced glass, the applicable temperature for boron-silicate glasses (7070, 7740, 7760, 7059 and the like) used for a circuit board such as in a liquid crystal device is 290° C. at the maximum (260° C. in general). In the bonding method of the present invention, heat applied from the semiconductor device is transmitted to the circuit board via the metal bumps or by radiation heat from the surface of the semiconductor device. The total amount of the transmitted heat is little, although a large amount of the heat is transmitted via the metal bumps to the circuit board, compared with the heat by the radiation heat therefrom. Experimentally, the temperature of the circuit board is about 200° C. lower than that of the semiconductor device. Accordingly, the 500°–550° C. bonding temperature as in Hatada et al. results in 300°–350° C. circuit board, which lowers the durability to heat of the glass substrate. On the other hand, barium boron-silicate glass, silica glass and the like, which have comparatively high durability to heat, are too expensive to be used in a liquid crystal device in practice. Therefore, the present invention displays large effects when applied to boron-silicate glass (7040–7760), barium boron-silicate glass (7059), soda glass (2473, 6720, 6750 and the like), soda barium-silicate glass (7800) and the like.

TABLE 2

| GLASS | | applicable tempearture | | | durability to temp. change (15 cm × 15 cm board) | | |
|---|---|---|---|---|---|---|---|
| | | glass slowly cooled | | reinforced glass | glass slowly cooled | | |
| CODE No. | GLASS | ordinary C.° | max C.° | ordinary C.° | max C.° | 3.2 mm C.° | 8.4 mm C.° | 12.7 mm °C. |
| 0010 | lead potash soda | 110 | 380 | — | — | 65 | 50 | 35 |
| 0080 | soda lime | 110 | 460 | 220 | 250 | 65 | 50 | 35 |
| 1720 | aluminosilicate | 200 | 650 | 400 | 450 | 135 | 115 | 75 |
| 2473 | soda zinc | 110 | 460 | — | — | 65 | 50 | 35 |
| 6720 | soda zinc | 110 | 480 | 220 | 275 | 70 | 60 | 40 |
| 6750 | soda barium | 110 | 420 | 220 | 220 | 65 | 50 | 35 |
| 7040 | boron-silicate glass | 200 | 430 | — | — | — | — | — |
| 7050 | boron-silicate glass | 200 | 440 | 235 | 235 | 125 | 100 | 70 |
| 7052 | boron-silicate glass | 200 | 420 | 210 | 210 | 125 | 100 | 70 |
| 7056 | boron-silicate glass | 200 | 460 | — | — | — | — | — |
| 7070 | boron-silicate glass | 230 | 430 | 230 | 230 | 180 | 150 | 100 |
| 7251 | boron-silicate glass | 230 | 460 | 260 | 260 | 160 | 130 | 90 |
| 7720 | boron-silicate glass | 230 | 460 | 260 | 260 | 160 | 130 | 90 |
| 7740 | boron-silicate glass | 230 | 490 | 260 | 290 | 160 | 130 | 90 |
| 7760 | boron-silicate glass | 230 | 450 | 260 | 250 | 160 | 130 | 90 |
| 7800 | soda barium silicate | 200 | 460 | — | — | — | — | — |
| 7059 | barium boron-silicate glass | — | — | — | — | — | — | — |
| 7913 | 96% silicic acid | 900 | 1200 | — | — | — | — | — |
| 7940 | silica glass | 900 | 1100 | — | — | — | — | — |

The durability to heat, especially heat by soldering and by oven, of various kinds of plastic substrate used as a printed substrate are indicated in Tables 3 and 4. Glass-epoxy resin (glass wool cured by epoxy resin; glass epoxy FR-4, glass epoxy G-10), used in general as a printed substrate, has 230°–260° C. durability to heat by oven. In Hatada et al., as described above, the temperature of the circuit board reaches about 300°–350° C., which damages the glass-epoxy resin. On the other hand, the present invention is applicable not only to glass-epoxy resin but also to polyimide resin, heat-resistant epoxy resin and a material having lower durability to heat (about 200° C.) such as paper-phenol resin, with no damage to the circuit board.

TABLE 3

| DURABILITY TO HEAT BY SOLDERING (under 280° C.) | TIME (sec) |
|---|---|
| low-permittivity polyimide GPY | 120~ |
| polyimide GPY | 120~ |
| denatured polyimide GPY | 120~ |
| high-heat-resistant expoxy resin FR-4 | 120~ |
| improved high-heat-resistant epoxy resin FR-4 | 120~ |
| glass-epoxy resin FR-4 | 120~ |
| glass epoxy resing G-10 | 120~ |
| new CEM-3 | 120~ |
| composite CEM-3 | 120~ |
| composite CEM-1 | 80–110 |
| paper-epoxy resin FR-3 | 45–65 |

TABLE 3-continued

| DURABILITY TO HEAT BY SOLDERING (under 280° C.) | TIME (sec) |
|---|---|
| paper-phenol FR-2 | 25–35 |
| paper-phenol FR-1 | 25–35 |
| paper-phenol XXXPC | 30–45 |
| paper-phenol XPC | 20–35 |
| glass-fluorocarbon resin | 120– |
| glass-thermosetting PPO | 120– |
| high-permittivity glass-thermosetting PPO | 120– |

TABLE 4

| DURABILITY TO HEAT BY OVEN (temperature under which no expanding is caused) | TEMPERATURE (°C.) |
|---|---|
| low-permittivity polyimide GPY | 250–260 |
| polyimide GPY | 280–290 |
| denatured polyimide GPY | 250–260 |
| high-heat-resistant expoxy resin FR-4 | 230–240 |
| improved high-heat-resistant epoxy resin FR-4 | 230–240 |
| glass-epoxy resin FR-4 | 230–240 |
| glass epoxy resing G-10 | 250–260 |
| new CEM-3 | 230–240 |
| composite CEM-3 | 230–240 |
| composite CEM-1 | 200–210 |
| paper-epoxy resin FR-3 | 200–210 |
| paper-phenol FR-2 | 200–205 |
| paper-phenol FR-1 | 200–205 |
| paper-phenol XXXPC | 205–210 |
| paper-phenol XPC | 205–210 |
| glass-fluorocarbon resin | 300–310 |
| glass-thermosetting PPO | 290–300 |
| high-permittivity glass-thermosetting PPO | 290–300 |

*In glass resin (epoxy resin) no expanding is caused for 60 minutes.

What is claimed is:

1. A method of packaging a semiconductor apparatus having a circuit board made of glass or plastic on which electrodes of wiring are formed and having a semiconductor device on which electrodes are formed to be connected to said electrodes of wiring via bumps composed of a metallic material having a melting point exceeding the highest temperature at which said circuit board can be used when the semiconductor device is mounted on said circuit board, said method comprising:

a preparation step of preliminarily forming a substrate with bumps on which the bumps are positioned corresponding to the electrodes of said semiconductor device;

a transferring/bonding process that includes the steps of, positioning said semiconductor device opposite to the substrate with bumps so that the electrodes of said semiconductor device are aligned with the bumps, applying a pressure to either said semiconductor device or said substrate with bumps so that one is pressed against the other, heating the electrodes of the semiconductor device and said bumps to form an alloy layer between said electrodes of the semiconductor device and said bumps, and then transferring said bumps from the substrate to the electrodes of the semiconductor device;

a re-alloying process that includes the steps of, positioning said semiconductor device opposite to said circuit board having said electrodes of wiring so that the bumps, which were transferred and bonded to the electrodes of the semiconductor device in said transferring/bonding process, are aligned with said electrodes of wiring, applying a pressure to either said semiconductor device or the circuit board so that one is pressed against the other, heating the electrodes of the semiconductor device and said bumps to form an alloy layer therebetween, which covers a wider range, and which strengthens the bonds between the electrodes of said semiconductor device and said bumps that were obtained in said transferring/bonding process; and a connecting step for strengthening an electrical connection between said bumps and said electrodes of wiring that includes the step of applying pressure without heating to either said semiconductor device or said circuit board so that one is pressed against the other after said re-alloying process.

2. A method of fabricating a semiconductor apparatus according to claim 1, wherein the pressure applied in said re-alloying process is larger than the pressure applied in said transferring/bonding process.

3. A method of fabricating a semiconductor apparatus according to claim 1, wherein heating in said re-alloying process is performed at a higher temperature than the temperature in said transferring/bonding process.

4. A method of fabricating a semiconductor apparatus according to claim 1, 2 or 3, wherein the application of heat and pressure in said re-alloying process is performed for a longer period of time than in said transferring/bonding process.

5. A method of packaging a semiconductor apparatus according to claim 2, wherein said re-alloying process and said connecting step for providing connections between the bumps and the electrodes of wiring are performed using the same tool.

6. A method of packaging a semiconductor apparatus according to claim 1, wherein said connecting step for strengthening connections between the bumps and electrodes of wiring is performed at least by fixing said bumps and electrodes of wiring by means of insulating resin.

7. A method of packaging a semiconductor apparatus according to claim 1, wherein said circuit board is made of a material selected from boron-silicate glass, barium boron-silicate glass, soda glass and soda barium silicate glass.

8. A method of packaging a semiconductor apparatus according to claim 1, wherein said circuit board is made of a material selected from glass-epoxy resin, polyimide resin, heat-resistant epoxy resin and paper phenol resin.

9. The method of packaging a semiconductor apparatus according to claim 1, wherein said bumps are made of gold.

10. The method of packaging a semiconductor apparatus according to claim 1, wherein the electrodes of said semiconductor device are made of Al.

* * * * *